United States Patent
Michael (10) Patent No.: US 9,367,392 B2
(45) Date of Patent: Jun. 14, 2016

(54) NAND FLASH MEMORY HAVING INTERNAL ECC PROCESSING AND METHOD OF OPERATION THEREOF

(71) Applicant: Winbond Electronics Corporation, Taichung (TW)

(72) Inventor: Oron Michael, San Jose, CA (US)

(73) Assignee: WINBOND ELECTRONICS CORPORATION, Taichung (TW)

( * ) Notice: Subject to any disclaimer, the term of this patent is extended or adjusted under 35 U.S.C. 154(b) by 79 days.

(21) Appl. No.: 14/450,188

(22) Filed: Aug. 1, 2014

(65) Prior Publication Data

US 2016/0034346 A1 Feb. 4, 2016

(51) Int. Cl.
| | |
|---|---|
| *H03M 13/15* | (2006.01) |
| *G06F 11/10* | (2006.01) |
| *H03M 13/13* | (2006.01) |
| *H03M 13/27* | (2006.01) |
| *G11C 16/26* | (2006.01) |
| *G11C 29/04* | (2006.01) |
| *H03M 13/19* | (2006.01) |

(52) U.S. Cl.
CPC .......... *G06F 11/1068* (2013.01); *H03M 13/13* (2013.01); *H03M 13/27* (2013.01); *G11C 16/26* (2013.01); *G11C 2029/0411* (2013.01); *H03M 13/152* (2013.01); *H03M 13/1515* (2013.01); *H03M 13/19* (2013.01)

(58) Field of Classification Search
CPC .................................................. H03M 13/2957
USPC .................................................. 714/755, 746
See application file for complete search history.

(56) References Cited

U.S. PATENT DOCUMENTS

| | | |
|---|---|---|
| 5,822,245 A | 10/1998 | Gupta et al. |
| 6,775,184 B1 | 8/2004 | Park et al. |
| 7,120,836 B1 | 10/2006 | Englin et al. |

(Continued)

FOREIGN PATENT DOCUMENTS

| | | |
|---|---|---|
| CN | 1902599 A | 1/2007 |
| EP | 1 635 261 A1 | 3/2006 |

(Continued)

OTHER PUBLICATIONS

Winbond Electronics Corporation. W25N01GV spiflash 3V 1G-Bit Serial SLC Nand Flash Memory with Dual/Quad SPI & Continuous Read, Preliminary Revision B, Nov. 26, 2013. 69 Pages.

(Continued)

*Primary Examiner* — Fritz Alphonse
(74) *Attorney, Agent, or Firm* — David H. Carroll (57) ABSTRACT

A continuous read operation may be achieved by using a data buffer having a partitioned data register and a partitioned cache register, user configurable internal ECC associated with the cache register, and fast bad block management. During a data read operation, the ECC status may be indicated by ECC status bits. The status (1:1), for example, may indicate for the Continuous Read Mode that the entire data output contains more than 4 bits errors/page in multiple pages. However, one may wish to know the ECC status of each page or of each page partition. For the former, the ECC status for the entire page may be determined and made in the status register at the end of the output of the page. For the latter, the ECC status of each page partition may be determined and output before output of the corresponding page partition.

7 Claims, 8 Drawing Sheets

(56) References Cited

U.S. PATENT DOCUMENTS

| | | | |
|---|---|---|---|
| 7,171,536 | B2 | 1/2007 | Chang et al. |
| 7,558,900 | B2 | 7/2009 | Jigour et al. |
| 7,559,004 | B1 | 7/2009 | Chang et al. |
| 7,822,965 | B2 | 10/2010 | Li et al. |
| 8,019,938 | B2 | 9/2011 | Flynn et al. |
| 8,051,358 | B2 * | 11/2011 | Radke ............... G06F 11/1072 365/185.09 |
| 8,103,936 | B2 | 1/2012 | Pekny et al. |
| 8,437,197 | B2 | 5/2013 | Takagiwa |
| 8,533,572 | B2 | 9/2013 | Lu et al. |
| 8,667,368 | B2 | 3/2014 | Gupta et al. |
| 8,898,548 | B1 | 11/2014 | Mullendore et al. |
| 9,124,432 | B2 * | 9/2015 | Nagai ................. H04L 9/0869 |
| 2003/0002366 | A1 | 1/2003 | Mizoguchi et al. |
| 2004/0153902 | A1 | 8/2004 | Machado et al. |
| 2005/0289314 | A1 | 12/2005 | Adusumilli et al. |
| 2008/0239809 | A1 | 10/2008 | Chae et al. |
| 2008/0313389 | A1 | 12/2008 | Chow et al. |
| 2009/0019215 | A1 | 1/2009 | Lee et al. |
| 2009/0150588 | A1 | 6/2009 | Wang et al. |
| 2009/0271567 | A1 | 10/2009 | Huang |
| 2010/0142275 | A1 | 6/2010 | Yogev et al. |
| 2011/0041039 | A1 | 2/2011 | Harari et al. |
| 2011/0238898 | A1 | 9/2011 | Honda |
| 2012/0069657 | A1 | 3/2012 | Choi et al. |
| 2012/0075931 | A1 | 3/2012 | Yuh |
| 2012/0155173 | A1 | 6/2012 | Lee et al. |
| 2013/0013817 | A1 | 1/2013 | Chen et al. |
| 2013/0080858 | A1 | 3/2013 | Lee et al. |
| 2013/0138879 | A1 | 5/2013 | Kulkarni |
| 2013/0339634 | A1 | 12/2013 | Zhang et al. |
| 2013/0346671 | A1 | 12/2013 | Michael et al. |
| 2014/0269065 | A1 | 9/2014 | Jigour et al. |

FOREIGN PATENT DOCUMENTS

| | | |
|---|---|---|
| JP | 06/005085 | 1/1994 |
| JP | 06-005085 | 1/1994 |
| JP | 08-045285 | 2/1996 |
| JP | 2000-57063 A | 2/2000 |
| JP | 2001-184874 | 7/2001 |
| JP | 2001-202792 | 7/2001 |
| JP | 2003-085054 | 3/2003 |
| JP | 2003-249082 | 9/2003 |
| JP | 2010-146654 | 3/2010 |
| JP | 2011-221996 | 11/2011 |
| JP | 2012-243338 A | 12/2012 |
| JP | 2014-038593 A | 2/2014 |
| TW | 201418990 A | 5/2003 |
| TW | 200935233 | 8/2009 |
| TW | 1351604 | 11/2011 |
| WO | 2005066790 A1 | 7/2005 |
| WO | 2006007264 A2 | 1/2006 |
| WO | 2010129305 A1 | 11/2010 |

OTHER PUBLICATIONS

Cooke, J. On-die ECC NAND, Micron Technologies, Inc. slides 25-1 and 25-2, 2009, [online] [retrieved on Oct. 5, 2012]. Retrieved from the Internet<URL:http://extmedia.micron.com/webmedia/ondieecc/ondieecc.html>.

Japanese Patent Office. Office Action: Japanese Patent Application No. 2013-055404, Feb. 12, 2014. 6 Pages.

Michael, Oron et al. Reply to Office Action: U.S. Appl. No. 13/530,518, Jun. 12, 2014. 31 Pages.

Michael, Oron et al. Reply to Office Action: U.S. Appl. No. 13/530,518, Nov. 11, 2014. 15 Pages.

Michael, Oron et al. Request for Continued Examination: U.S. Appl. No. 13/530,518, Feb. 2, 2015. 26 Pages.

Micron Technology, Inc. NAND Flash Memory, MT29F2G08AABWP, MT29F2G16AABWP, MT29F4G08BABWP, MT29F4G16BABWP, MT29F8G08FABWP, 2004. 57 Pages.

Micron Technology, Inc. Technical Note TN-29-01: NAND Flash Performance Increase Using the Micron Page Read Cache Mode Command, 2004. 10 Pages.

Micron Technology, Inc. Technical Note TN-29-17: Design and Use Considerations for NAND Flash Memory, 2006.8 Pages.

Micron Technology, Inc. Technical Note TN-29-19: NAND Flash 101: An Introduction to NAND Flash and How to Design It to Your Next Product, 2006. 27 Pages.

Micron Technology, Inc. Technical Note TN-29-42: Wear-Leveling Techniques in NAND Flash Devices, 2008. 8 Pages.

Micron Technology, Inc. Technical Note TN-29-59: Bad Block Management in NAND Flash Memory, 2011. 4 Pages.

United States Patent and Trademark Office. Advisory Action: U.S. Appl. No. 13/530,518, Jan. 2, 2015. 3 Pages.

United States Patent and Trademark Office. Office Action: U.S. Appl. No. 13/530,518, Feb. 19, 2014. 35 Pages.

United States Patent and Trademark Office. Office Action: U.S. Appl. No. 13/530,518, Sep. 11, 2014. 36 Pages.

Winbond Electronics Corporation. W25Q64DW spiflash 1.8V 64M-Bit Serial Flash Memory with Dual/Quad SPI and QPI, Preliminary Revision C, Jan. 13, 2011.82 Pages.

Hynix Inc. 1Gbit (128M×8bit / 64 M×16bit) NAND Flash Memory, Rev. 1.1, Nov. 2005. 48 Pages.

Hynix Inc. 4Gb (512M×bit) NAND Flash HY27UF084G2M, Rev. 0.3, Nov. 2005. 54 Pages.

Micron Technology, Inc. 1Gb NAND Flash Memory, Revision E, 2006. 70 Pages.

Micron Technology, Inc. Get More for Less in Your Embedded Designs with Serial NAND Flash, Jul. 28, 2009. 2 Pages.

Micron Technology, Inc. Micron on Die ECC Webinar, Topic 4, Offerings—Serial (SPI) (Slides), 2009. 3 Pages.

Micron Technology, Inc. NAND Flash Memory, Serial Peripheral Interface (SPI) MT29F1G01ZAC, 2009. 2 Pages.

Winbond Electronics Corporation. W25N01GV 3V 1G-Bit Serial Spin and Flash Memory With Dual/Quad SPI, Preliminary Revision A, Feb. 11, 2013. 61 Pages.

Winbond Electronics Corporation. W25Q64CV spiflash 3V 64M-Bit Serial Flash Memory With Dual and Quad SPI, Revision F, May 7, 2012. 80 Pages.

Winbond Electronics Corporation. W25Q128FV spiflash 3V 128M-Bit Serial Flash Memory With Dual/Quad SPI and QPI, Revision D, Oct. 1, 2012. 97 Pages.

Taiwan Intellectual Property Office. Office Action: Taiwan Patent Application No. 103144717, Mar. 2, 2016. 8 Pages.

Cooke, J. The Inconvenient Truths of NAND Flash Memory, Flash Memory Summit, Santa Clara, CA, Micron Technologies, Inc. Aug. 2007. 32 Pages.

Cooke, J. On-die ECC NAND, Micron Technologies, Inc., slide 13, 2009, [online] [retrieved on Apr. 13, 2012]. Retrieved from the Internet<URL:http://extmedia.micron.com/webmedia/ondiecc/ondiecc.html>.

Elnec. NAND Flash Memories and Programming NAND Flash Memories Using ELNEC Device Programmers: Application Note, Version 2.10, Aug. 2008. 44 Pages.

Micron Technology, Inc. Technical Note TN-29-25: Improving NAND Flash Performance Using Two-Plane Command Enabled Micron Devices MT29F4G08AAA, MT29F8G08BAA. MT29F8G08DAA, MT29F16G08FAA, MT29F8G08MAA, MT29F16G08QAA, and MT29F32G08TAA, 2007. 27 Pages.

Nexflash Technologies, Inc. NX25F640C 64M-Bit Serial Flash Memory with 4-Pin SPI Interface, Nov. 2002. 24 Pages.h.

Japanese Patent Office. Office Action: Japanese Patent Application No. 2015-048006, Mar. 15, 2016. 11 Pages.

* cited by examiner

NAND FLASH MEMORY HAVING INTERNAL ECC PROCESSING AND METHOD OF OPERATION THEREOF

BACKGROUND OF THE INVENTION

1. Field of the Invention

The present invention relates to digital memory devices and operation thereof, and more particularly to NAND flash memory having internal ECC processing and methods of operation thereof.

2. Description of Related Art

NAND flash memory is popular for data storage. The cost versus density advantage of single level cell ("SLC") NAND flash memory in densities of 512 Megabits and higher is largely due to the inherently smaller memory cell size used in SLC NAND flash technology.

NAND flash memory is also becoming popular for a variety of applications in addition to data storage, including code shadowing. Although commonly used SLC NAND flash memory has architectural, performance, data integrity, and bad block limitations that make it difficult to support the high speed code shadow applications for which serial NOR flash memory is well suited, various techniques have been developed to adapt NAND flash memory to such applications.

Error Correction Code ("EEC") algorithms have been developed to manage the data integrity issue. In one approach, an internal ECC calculation is done during page programming, and the resulting EEC information is stored in the extra 64-Byte area known as the spare area for each page. During the data read operation, the ECC engine verifies the data according to the previously-stored ECC information, and to a limited extent, makes the indicated corrections. The verification and correction status is indicated by ECC Status Bits ECC-1 and ECC-0, in the following manner. ECC-1, ECC-0 status (0:0) indicates that the entire data output is successful, without the need for any ECC correction. ECC-1, ECC-0 status (0:1) indicates that the entire data output is successful, with 1~4 bit/page ECC corrections in either a single page or multiple pages. ECC-1, ECC-0 status (1:0) indicates that the entire data output contains more than 4 bits errors only in a single page which cannot be repaired by ECC. The data is not suitable for use. In the Continuous Read Mode, an additional command may be used to read out the Page Address (PA) of the page containing the errors. ECC-1, ECC-0 status (1:1) indicates that the entire data output contains more than 4 bits errors/page in multiple pages. In the Continuous Read Mode, the additional command provides the Page Address (PA) of the last page containing the errors. The PAs of the other failed pages is not reported.

BRIEF SUMMARY OF THE INVENTION

One embodiment of the present invention is a method of sequentially reading data from a digital memory device comprising a NAND memory array and a page buffer coupled thereto, the page buffer being partitioned into at least a first part and a second part, comprising: accessing a page of data from the NAND memory array; establishing first error correction code ("ECC") processed data in the first part of the page buffer from the page of data; determining a first ECC status for the first ECC processed data; outputting the first ECC processed data from the first part of the page buffer; establishing second ECC processed data in the second part of the page buffer from the page of data, in an overlapping time relationship with the first ECC processed data outputting step; determining, from the first ECC status for the first ECC processed data and during the second ECC processed data establishing step, a second ECC status for a page of data comprising the first ECC processed data and the second ECC processed data; storing the second ECC status in a status register; accessing a first sequential page of data from the NAND memory array, in an overlapping time relationship with the first ECC processed data outputting step; outputting the second ECC processed data from the second part of the page buffer; establishing third ECC processed data in the first part of the page buffer from the first sequential page of data, in an overlapping time relationship with the second ECC processed data outputting step; determining a third ECC status for the third ECC processed data; outputting the third ECC processed data from the first part of the page buffer; establishing fourth ECC processed data in the second part of the page buffer from the first sequential page of data, in an overlapping time relationship with the third ECC processed data outputting step; determining, from the third ECC status for the third ECC processed data and during the fourth ECC processed data establishing step, a fourth ECC status for a page of data comprising the third ECC processed data and the fourth ECC processed data; storing the fourth ECC status in the status register; and accessing a second sequential page of data from the NAND memory array, in an overlapping time relationship with the third ECC processed data outputting step.

Another embodiment of the present invention is a digital memory device comprising: a NAND flash memory array; a row decoder coupled to the NAND flash memory array; a data register coupled to the NAND flash memory array and comprising at least a first part and a second part; a cache register coupled to the data register and comprising at least a first part and a second part corresponding to the first and second parts of the data register; an error correction code ("ECC") circuit coupled to the cache register; a column decoder coupled to the cache register; and a control circuit coupled to the row decoder, the column decoder, the data register, the cache register, and the ECC circuit. The control circuit comprises logic and register elements for executing the functions of: loading a page of data from the NAND memory array into the data register; replicating a first portion of the page of data from the first part of the data register to the first part of the cache register; establishing first ECC processed data in the first part of the cache register from the first portion of the page of data; determining a first ECC status for the first ECC processed data; outputting the first ECC processed data from the first part of the cache register; replicating a second portion of the page of data from the second part of the data register to the second part of the cache register; establishing second ECC processed data in the second part of the cache register from the second portion of the page of data, in an overlapping time relationship with the first ECC processed data outputting function; determining, from the first ECC status for the first ECC processed data and as part of the second ECC processed data establishing function, a second ECC status for a page of data comprising the first ECC processed data and the second ECC processed data; storing the second ECC status in a status register; loading a first sequential page of data from the NAND memory array into the data register, in an overlapping time relationship with the first ECC processed data outputting function; outputting the second ECC processed data from the second part of the cache register; replicating a first portion of the first sequential page of data from the first part of the data register to the first part of the cache register; establishing third ECC processed data in the first part of the cache register from the first portion of the first sequential page of data, in an overlapping time relationship with the second ECC processed data outputting function; determining a third ECC status for the third ECC processed data; outputting the third ECC processed data from the first part of the cache register; replicating a second portion of the first sequential page of data from the second part of the data register to the second part of the cache register; establishing fourth ECC processed data in the second part of the cache register from the second portion of the first sequential page of data, in an overlapping time relationship with the third ECC processed data outputting function; determining, from the third ECC status for the third ECC processed data and as part of the fourth ECC processed data establishing function, a fourth ECC status for a page of data comprising the third ECC processed data and the fourth ECC processed data; storing the fourth ECC status in the status register; and loading a second sequential page of data from the NAND memory array into the data register, in an overlapping time relationship with the third ECC processed data outputting function.

Another embodiment of the present invention is a method of sequentially reading data from a digital memory device comprising a NAND memory array and a page buffer coupled thereto, the page buffer being partitioned into at least a first part and a second part, comprising: accessing a page of data from the NAND memory array; establishing first error correction code ("ECC") processed data in the first part of the page buffer from the page of data; determining a first ECC status for the first ECC processed data; outputting the first ECC processed data from the first part of the page buffer; establishing second ECC processed data in the second part of the page buffer from the page of data, in an overlapping time relationship with the first ECC processed data outputting step; determining, from the first ECC status for the first ECC processed data and during the second ECC processed data establishing step, a second ECC status for a page of data comprising the first ECC processed data and the second ECC processed data; storing the second ECC status; accessing a first sequential page of data from the NAND memory array, in an overlapping time relationship with the first ECC processed data outputting step; outputting the second ECC processed data from the second part of the page buffer, and the second ECC status from the storing step; establishing third ECC processed data in the first part of the page buffer from the first sequential page of data, in an overlapping time relationship with the second ECC processed data outputting step; determining a third ECC status for the third ECC processed data; outputting the third ECC processed data from the first part of the page buffer; establishing fourth ECC processed data in the second part of the page buffer from the first sequential page of data, in an overlapping time relationship with the third ECC processed data outputting step; determining, from the third ECC status for the third ECC processed data and during the fourth ECC processed data establishing step, a fourth ECC status for a page of data comprising the third ECC processed data and the fourth ECC processed data; storing the fourth ECC status; and accessing a second sequential page of data from the NAND memory array, in an overlapping time relationship with the third ECC processed data outputting step.

Another embodiment of the present invention is a method of sequentially reading data from a digital memory device comprising a NAND memory array and a page buffer coupled thereto, the page buffer being partitioned into at least a first part and a second part, comprising: accessing a page of data from the NAND memory array; establishing first error correction code ("ECC") processed data in the first part of the page buffer from the page of data; determining a first ECC status for the first ECC processed data; outputting the first ECC status; outputting the first ECC processed data from the first part of the page buffer, following the first ECC status outputting step; accessing a first sequential page of data from the NAND memory array, in an overlapping time relationship with the first ECC processed data outputting step; establishing second ECC processed data in the second part of the page buffer from the page of data, in an overlapping time relationship with the first ECC processed data outputting step; determining a second ECC status for the second ECC processed data; outputting the second ECC status; outputting the second ECC processed data from the second part of the page buffer, following the second ECC status outputting step; establishing third ECC processed data in the first part of the page buffer from the first sequential page of data, in an overlapping time relationship with the second ECC processed data outputting step; determining a third ECC status for the third ECC processed data; outputting the third ECC status; outputting the third ECC processed data from the first part of the page buffer, following the third ECC status outputting step; accessing a second sequential page of data from the NAND memory array, in an overlapping time relationship with the third ECC processed data outputting step; and establishing fourth ECC processed data in the second part of the page buffer from the first sequential page of data, in an overlapping time relationship with the third ECC processed data outputting step.

DETAILED DESCRIPTION OF THE INVENTION

NAND memory devices may be made compatible with many characteristics of serial NOR memory devices, including: (1) the multi-I/O SPI/QPI interface; (2) small low pin count package types (as small as 8×6 mm at densities of 256 Mb and higher) such as, for example, the 8-contact WSON, 16-pin SOIC, and the 24-ball BGA type packages, with the flexibility of using larger packages such as VBGA-63 typically used with ordinary parallel and ordinary serial NAND flash memory; (3) high clock frequency operation (illustratively 104 MHz) for high transfer rates (illustratively 50 MB/Sec); (4) continuous read with Error Correction Code ("ECC") processing across page boundaries without wait intervals, for fast code shadowing applications; (5) logically contiguous addressable good memory through bad block management which is transparent to the external systems and which is without adverse impact on the speed and continuity of the output; and (6) an output starting address of zero or alternatively any other address within the user-addressable space of the memory array via a user-specified or manufacturer-specified value. The Continuous Read Mode is particularly suitable for code shadowing to RAM, execute-in-place ("XIP"), and rapid retrieval of large voice, video, text and data segments. Various techniques may be used to achieve a fast and efficient continuous read operation, such as a data buffer having a partitioned data register and a partitioned cache register, user configurable internal ECC associated with the cache register, and fast bad block management. These and other techniques for overcoming the architectural, performance, unreliability, and bad block limitations that make it difficult to support high speed code shadow and XIP applications with NAND flash memory are described in U.S. Pat. No. 8,667,368 Issued Mar. 4, 2014 to Gupta et al. and entitled "Method and Apparatus for Reading NAND Flash Memory," US Patent Application Publication No. 2013/0346671 published Dec. 26, 2013 in the name of Michael et al. and entitled "On-Chip Bad Block Management for NAND Flash Memory," and US Patent Application Publication No. 2014/0269065 published Sep. 18, 2014 in the name of Jigour et al. and entitled "NAND Flash Memory," all of which hereby are incorporated herein in their entirety by reference thereto.

One device which offers a continuous read operation is type W25N01 GV, which is available from Winbond Electronics Corporation of San Jose, Calif., USA, and is described in Winbond Electronics Corporation, W25N01 GV SpiFlash 3V 1 G-Bit Serial SLC NAND Flash Memory with Dual/Quad SPI & Continuous Read, Preliminary Revision B, Nov. 26, 2013, which hereby is incorporated herein in its entirety by reference thereto. The type W25N01 GV device incorporates a traditional large NAND non-volatile memory space, specifically a 1 G-bit memory array organized into 65,536 programmable pages of 2,048-bytes each. The device also incorporates a Serial Peripheral Interface ("SPI") including bit-serial SPI as well as dual serial, quad serial, and quad I/O serial SPI. SPI clock frequencies of up to 104 MHz are supported, allowing equivalent clock rates of 208 MHz (104 MHz×2) for Dual I/O and 416 MHz (104 MHz×4) for Quad I/O when using the Fast Read Dual/Quad I/O instructions. The W25N01 GV device is switchable between a Buffer Read Mode (BUF=1) for accessing data in the page buffer, and a Continuous Read Mode (BUF=0) for efficiently accessing the entire memory array with a single read instruction.

The W25N01 GV device has an effective Error Correction Code ("EEC") capability to manage data integrity. During the data read operation, the ECC engine verifies the data and to a limited extent, makes corrections. The verification and correction status is indicated by ECC Status Bits ECC-1 and ECC-0. The ECC-1, ECC-0 status (1:1), for example, which is applicable only for the Continuous Read Mode, indicates that the entire data output contains more than 4 bits errors/page in multiple pages. In the Continuous Read Mode, the additional command provides the Page Address (PA) of the last page containing the errors, and the PAs of the other failure pages is not reported. The ECC-1, ECC-0 status (1:1) generally is sufficient, since bit errors per page in excess of four over multiple pages is rare. However, in some instances, one may wish to know the ECC status of each page.

Figure 1:
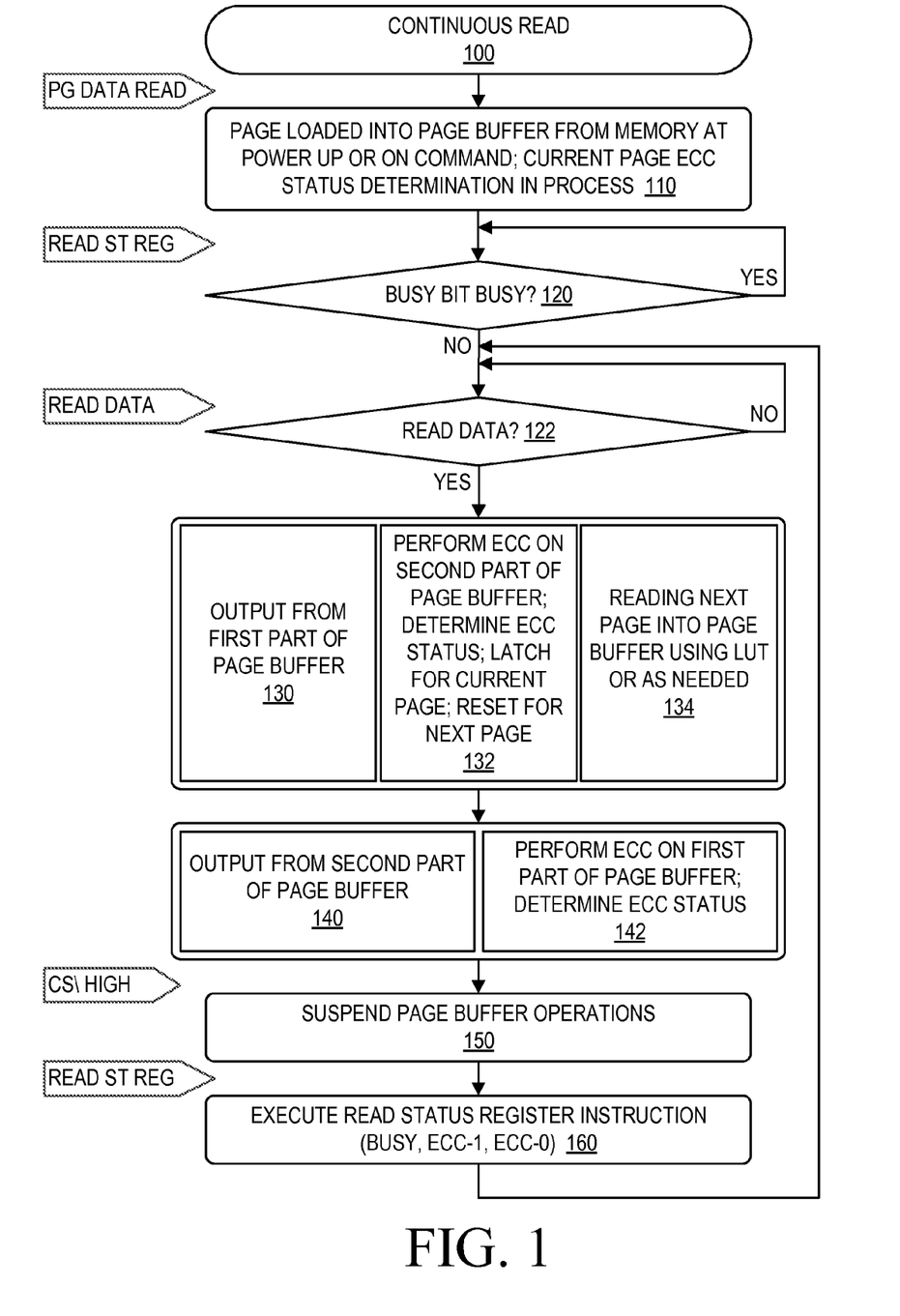
FIG. 1 is a flowchart showing the operations of a NAND flash memory for a continuous read.
Figure 2:
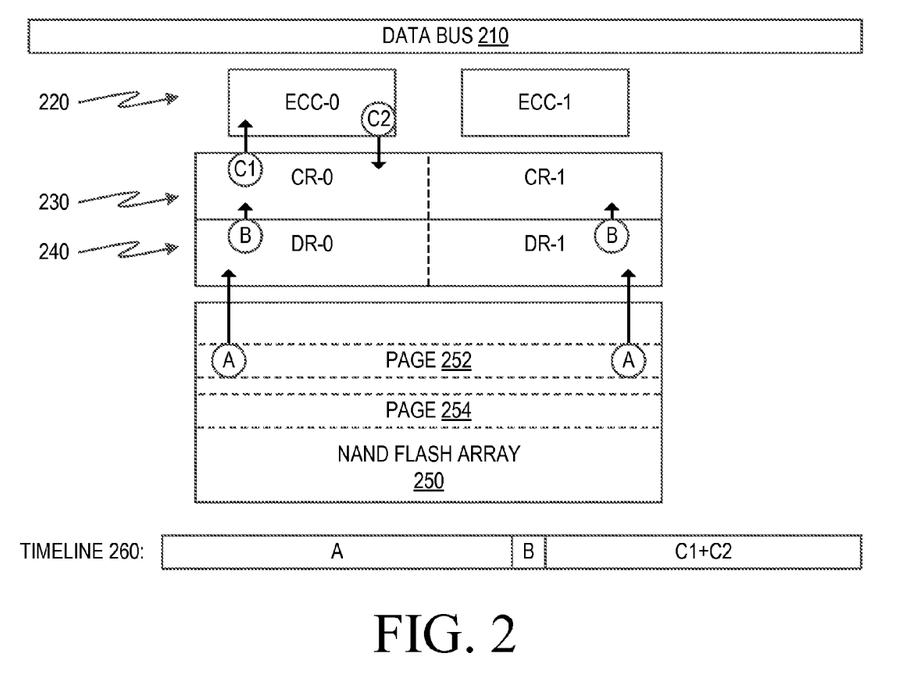
FIG. 2 is a functional block diagram of the functioning of a page buffer having a data register and a cache register during a portion of the continuous read process of FIG. 1.
Figure 3:
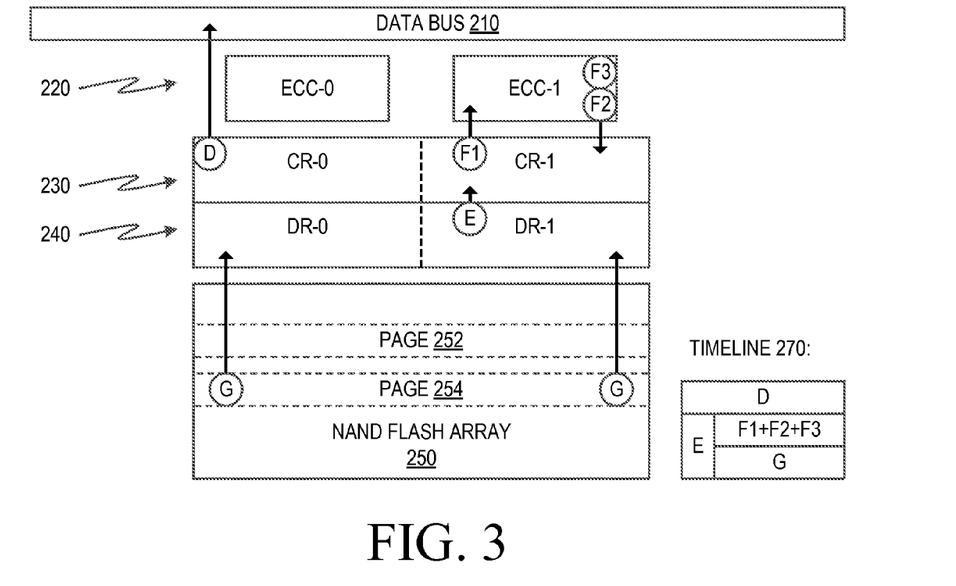
FIG. 3 is a functional block diagram of the functioning of a page buffer having a data register and a cache register during another portion of the continuous read process of FIG. 1.
Figure 4:
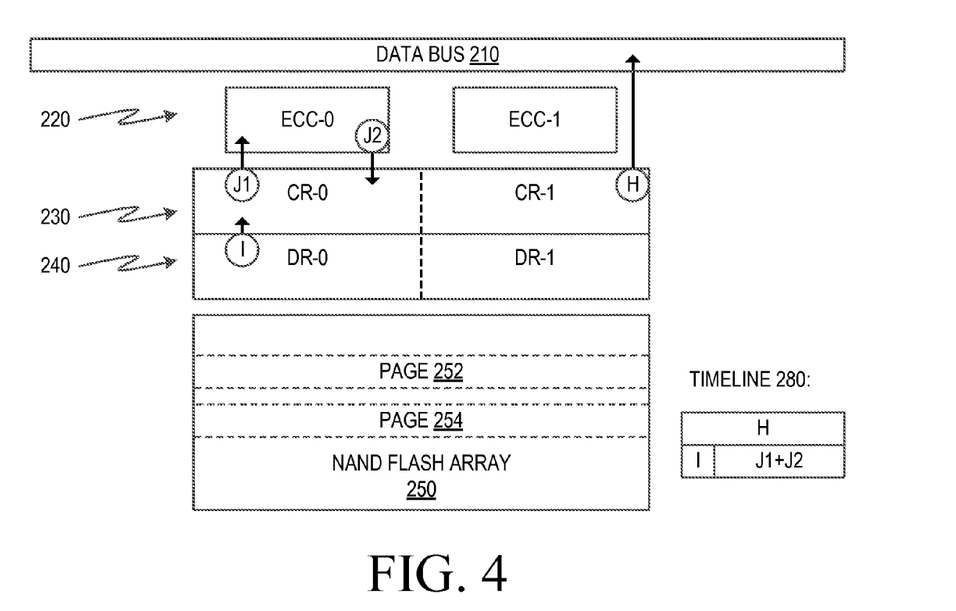
FIG. 4 is a functional block diagram of the functioning of a page buffer having a data register and a cache register during another portion of the continuous read process of FIG. 1.
Figure 6:
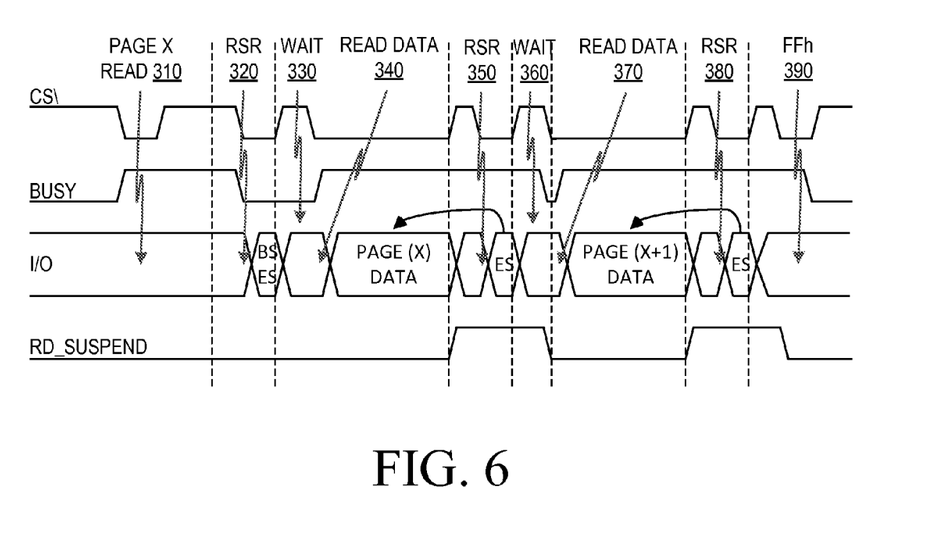
FIG. 6 is a signal diagram showing various signals involved in the functioning of a page buffer having a data register and a cache register as shown in FIGS. 1-4.

FIG. 1 is a flowchart showing various operations for carrying out a continuous page read 100 with page-by-page ECC status, FIGS. 2-4 show the various operations as carried out within particular circuits of the NAND memory device, and FIG. 6 shows various signals involved in the operations. The page-by-page ECC status mode may be enabled and disabled in any desired manner, an illustrative technique being the setting and resetting of a user configuration bit. A page is loaded into the page buffer, either automatically at power-up (illustratively page 0 of the NAND memory array) or in response to a Page Data Read instruction (see 310 in FIG. 6) or in any other desired manner (block 110). As shown in FIG. 2, two one-page registers cooperate to provide a page buffer, specifically a data register 240 which is partitioned into two parts DR-0 and DR-1, and a cache register 230 which is partitioned into two parts CR-0 and CR-1 which correspond to parts DR-0 and DR-1 of the data register 240. A page 252 is loaded during a first period A into the data register 240, the page is then replicated to the cache register 230 during a second period B (the page may be replicated in its entirety as shown, or only the first part DR-0 of the data register 240 may be replicated to the first part CR-0 of the cache register 230), and ECC processing is performed on the CR-0 part of the cache register 230 over a third period C1+C2, where C1 indicates the time for transfer of data from CR-0 to a first part ECC-0 of ECC circuit 220, and C2 indicates ECC processing time as well as the time for transfer of data from ECC-0 to CR-0. If desired, ECC processing may also be performed on the CR-1 part of the cache register 230 over a fourth period (not shown). These operations are sequential so that the periods are cumulative, as shown in the timeline 260.

With further reference to FIG. 1, the status of the BUSY bit ("BS") may be checked (block 120) by using a Read Status Register (0Fh/05h) instruction containing the address of the status register containing the BUSY bit (see 320 in FIG. 6). The status register bits are then shifted out on the DO pin at the falling edge of CLK. The ECC Status ("ES") bits may also be accessed in this manner, although they may be ignored at this time. The Read Status Register instruction may be used at any time, thereby allowing the BUSY status bit to be checked to determine when the cycle is complete and whether the device can accept another instruction. The Status Register may be read continuously. The instruction may be completed by driving CS\ high.

When the BUSY bit has been cleared (block 120—no) after a wait period 320 (FIG. 6) and a Read Data instruction 340 (FIG. 6) received (block 122—yes), a continuous page read may now proceed by performing ECC processing of data and output of data from the two parts CR-0 and CR-1 of the cache register 230 in alternation, further coordinated with replication of data from the data register 240 to the cache register 230 and the loading of subsequent pages such as 254 from the NAND flash array 250 into the data register 240. As indicated by blocks 130, 132 and 134, a read data 340 (FIG. 6) proceeds with three different operations which occur with substantial overlap during the same period of time, namely outputting of data onto the data bus 210 from the first part CR-0 of the cache register 230, performing ECC on the second part CR-1 of the cache register 230, and loading a successive page 254 of the NAND flash array 250 into the data register 240. As shown in FIG. 3, the output of data occurs over a time period D, the ECC processing occurs over a time period F1+F2+F3, and the page load occurs over a time period G, with the time periods D, F1+F2+F3, and G overlapping substantially as shown in timeline 270. A short period E is used to replicate the second part DR-1 of the data register 240 to the second part CR-1 of the cache register 230, and while the period E precedes the periods F1+F2+F3 and G and therefore adds to those time periods, it may overlap the period D.

For a first Read Data instruction which follows a Page Data Read instruction that causes ECC processing of data in both parts CR-0 and CR-1 of the cache register 230, the data replication over the time period E and the ECC processing over the time period F1+F2+F3 for the ECC may be skipped.

Figure 5:
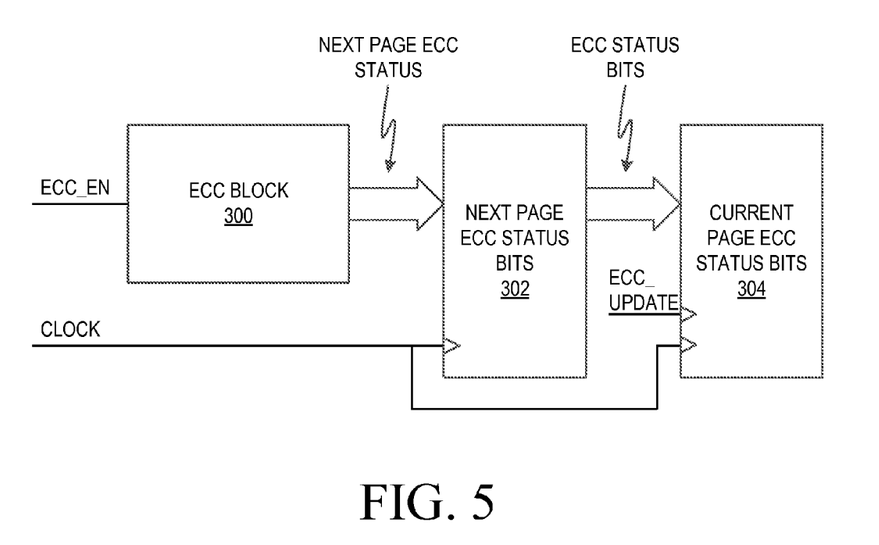
FIG. 5 is a functional block diagram of a pipeline circuit for ECC status pipelining.

The ECC status bits for the current page and the next page may be pipelined to ensure that the ECC status bits are synchronized with the outputted page. The ECC status bits for the current page are finally determined when ECC processing of the second part of the page buffer is completed (block 132), and then are latched during period F3 (FIG. 3) into the status register so that the ECC status bits for the next page may be determined without prematurely modifying the ECC status bits in the status register. An illustrative circuit suitable for implementing the pipeline is shown in FIG. 5. ECC processing is performed in the ECC block 300 when enabled by signal ECC_EN. The next page ECC status bits 302 are clocked by a clock signal CLOCK and updated with the next page ECC status from the ECC block 300. When the next page ECC status bits 302 are completed and essentially become the current page ECC status bits, they are latched into the current page ECC status bits 304 under control of signal ECC_UPDATE and the clock signal CLOCK. The ECC status bits 304 may be in the status register, if desired. The current page ECC status bits in the status register are therefore synchronized with the outputted page, and the new next page ECC status bits 302 may be determined without prematurely modifying the ECC status bits in the status register.

Next, as indicated by blocks 140 and 142, two different operations occur with substantial overlap during the same period of time, namely outputting of data onto the data bus 210 from the second part CR-1 of the cache register 230, and performing ECC on the first part CR-0 of the cache register 230 along with beginning the determination of ECC status. As shown in FIG. 4, the output of data occurs over a time period H, and the ECC processing occurs over a time period J1+J2, with the time periods H and J1+J2 overlapping substantially as shown in timeline 280. The ECC processing which occurs over the time period J1+J2 begins the determination of the next page ECC status bits, but appropriate measures such as pipelining may be taken to ensure that the current page ECC status bits remain valid for the outputted page. A short period I is used to replicate the first part DR-0 of the data register 240 to the first part CR-0 of the cache register 230, and while the period I precedes and therefore adds to the period J1+J2, it may overlap the period H.

Next, the continuous page read may be suspended on the page boundary (block 150) so that the ECC status bits corresponding to the just outputted page may be read. A suitable technique to suspend the continuous page read is to take CS\ high after reading the last page byte. When the CS\ transitions high when the page-by-page ECC mode is enabled, internal operations are suspended so that the controller may read out the ECC status of the just-outputted page using a Read Status Register instruction (block 160) (see 350 in FIG. 6). When the Busy Bit is cleared (not shown) and after a suitable wait period (see 360 in FIG. 6), a further Read Data instruction may be issued (see 370) to resume the continuous page read operation.

After the ECC status bits for the last page of the continuous page read operation are read (see 380 in FIG. 6) the continuous page read with page-by-page ECC may be terminated in any desired manner, such as by issuing the FFh instruction after pausing on a page boundary (see 390 in FIG. 6) or by taking CS\ high during page data outputting.

Figure 7:
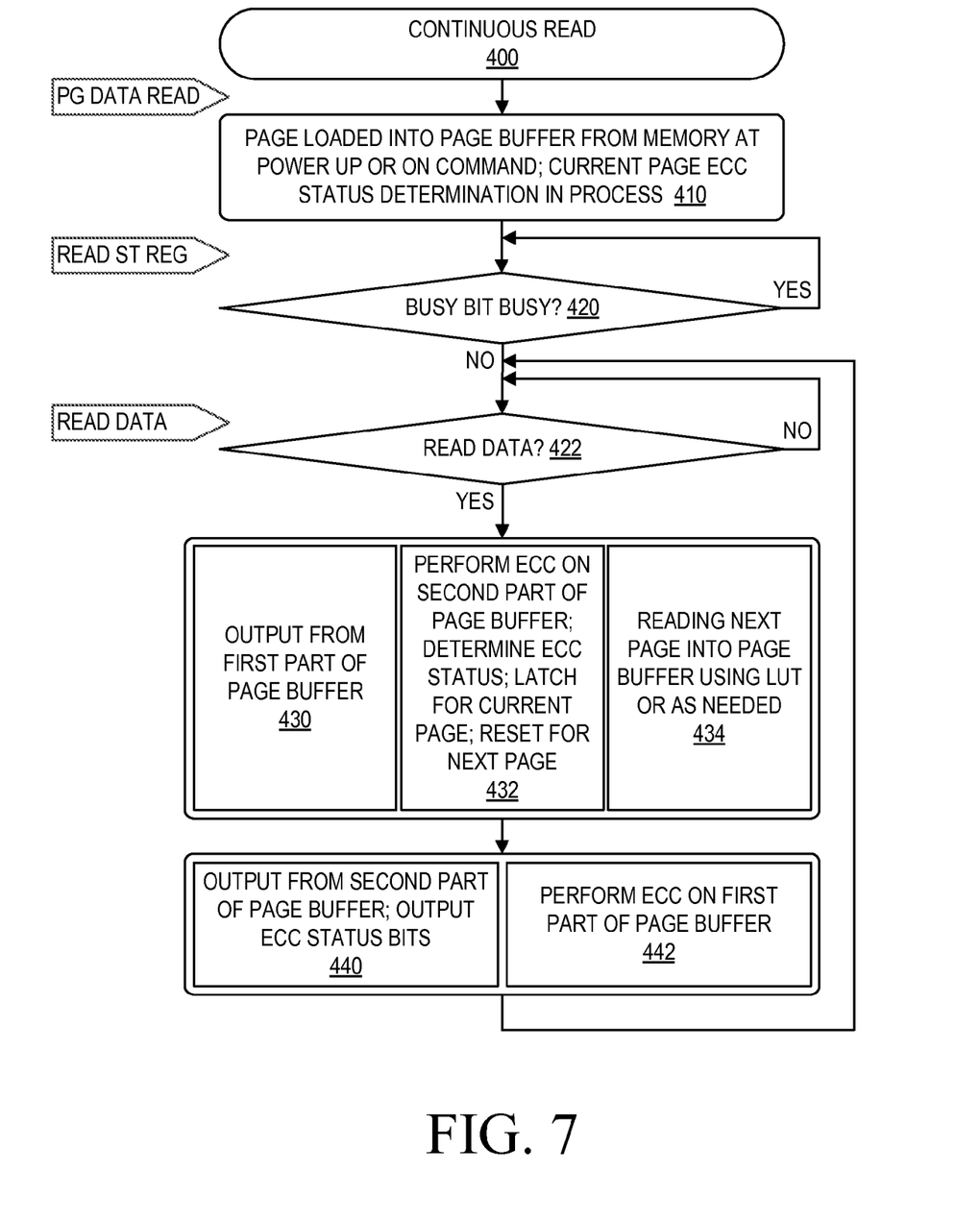
FIG. 7 is a flowchart showing the operations of a NAND flash memory for a continuous read.
Figure 8:
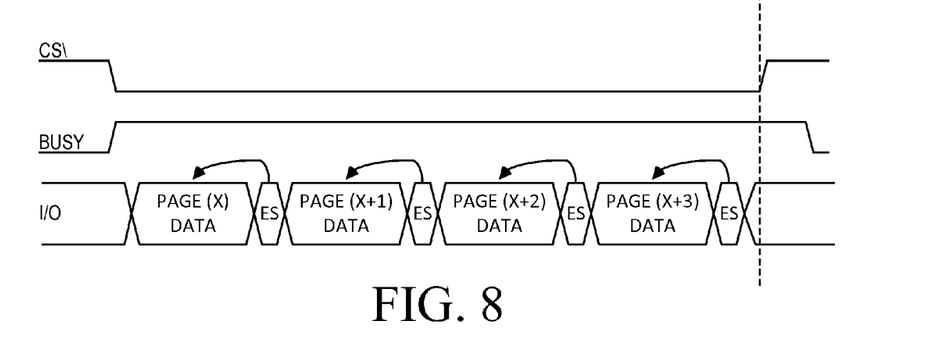
FIG. 8 is a signal diagram showing various signals involved in the functioning of a page buffer having a data register and a cache register as shown in FIG. 7.

FIG. 7 is a flowchart showing various operations for carrying out a continuous page read 400 with page-by-page ECC status, in which the Continuous Page Read instruction is effective for outputting not only successive pages of data, but also the ECC status bits for each of the successive pages. Illustratively, a partitioned one-page page register and a partitioned one-page cache register cooperate to provide a page buffer, generally in the manner shown in and described with reference to FIGS. 2-4. FIG. 8 shows various signals involved in the operations. The page-by-page ECC status mode may be enabled and disabled in any desired manner, an illustrative technique being the setting and resetting of a user configuration bit.

With reference to FIG. 7, a page is loaded into the page buffer, either automatically at power-up (illustratively page 0 of the NAND memory array) or in response to a Page Data Read instruction, or in any other desired manner (block 410). The page is then replicated to the cache register (the page may be replicated in its entirety, or only the first part of the data register may be replicated to the first part of the cache register), and ECC processing is performed on the first part of the cache register.

With further reference to FIG. 7, the status of the BUSY bit ("BS") may be checked (block 420) by using a Read Status Register (0Fh/05h) instruction containing the address of the status register containing the BUSY bit. The status register bits are then shifted out on the DO pin at the falling edge of CLK. When the BUSY bit has been cleared (block 420—no) and a Read Data instruction received (block 422—yes), a continuous page read may now proceed by performing ECC processing of data and output of data from the two parts CR-0 and CR-1 of the cache register in alternation, further coordinated with replication of data from the data register to the cache register and the loading of subsequent pages from the NAND flash array into the data register. As indicated by blocks 430, 432 and 434, a read data proceeds with three different operations which occur with substantial overlap during the same period of time, namely outputting of data onto the data bus from the first part CR-0 of the cache register, performing ECC on the second part CR-1 of the cache register, and loading a successive page of the NAND flash array into the data register. The ECC status bits for the current page and the next page may be pipelined generally in the manner shown in and described with reference to FIGS. 3-5, to ensure that the ECC status bits are synchronized with the outputted page. Next, as indicated by blocks 440 and 442, two different operations occur with substantial overlap during the same period of time, namely outputting of data onto the data bus from the second part CR-1 of the cache register followed by outputting of the ECC status bits, and performing ECC on the first part CR-0 of the cache register.

After the last page of the continuous page read operation and the ECC status bits for that page are read, the continuous page read with page-by-page ECC may be terminated in any desired manner, such as by taking CS\ high during page data outputting as shown in FIG. 8.

Figure 9:
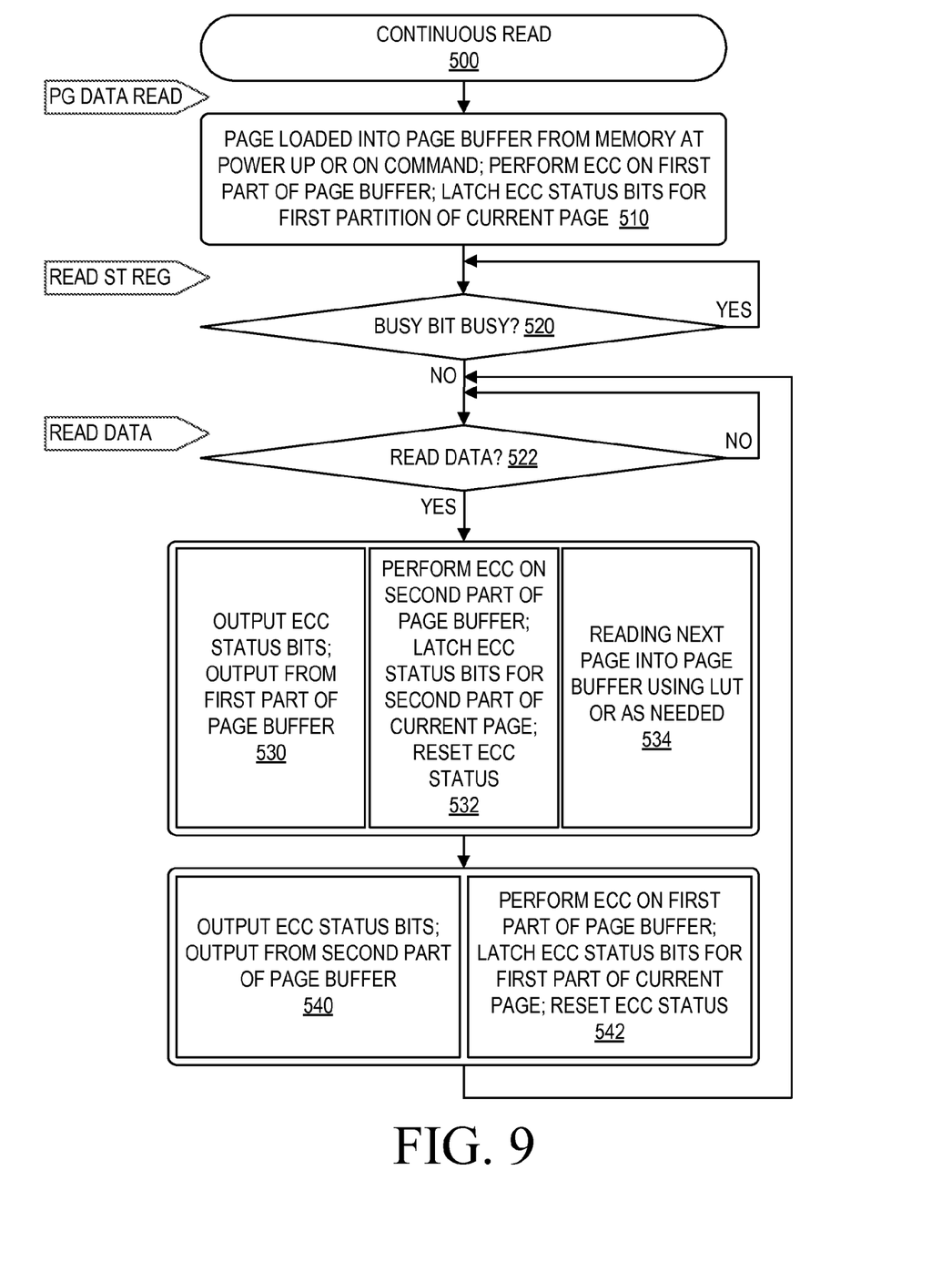
FIG. 9 is a flowchart showing the operations of a NAND flash memory for a continuous read.
Figure 10:
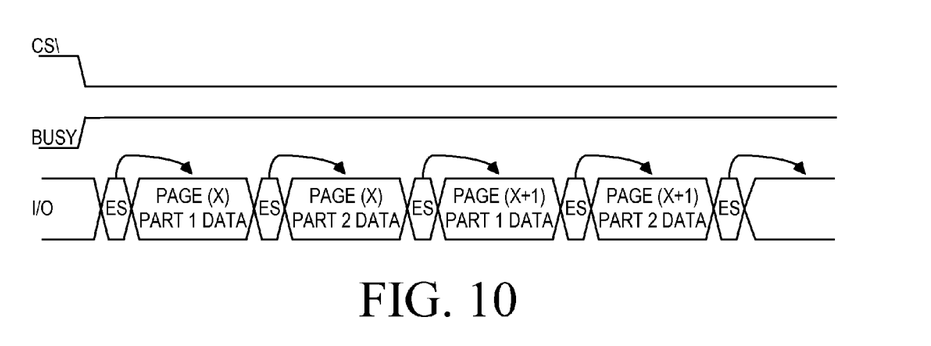
FIG. 10 is a signal diagram showing various signals involved in the functioning of a page buffer having a data register and a cache register as shown in FIG. 9.

FIG. 9 is a flowchart showing various operations for carrying out a continuous page read 500 with partition-by-partition ECC status, in which the Continuous Page Read instruction is effective for outputting not only successive pages of data, but also the ECC status bits for each partition of each of the successive pages. Moreover, the ECC status may be provided in advance of the outputted page. In this manner, the user may know prior to reading the data if it is or is not usable, and will know with greater precision where the bit failure is located. Illustratively, a partitioned one-page page register and a partitioned one-page cache register cooperate to provide a page buffer, generally in the manner shown in and described with reference to FIGS. 2-4. FIG. 10 shows various signals involved in the operations. The partition-by-partition ECC status mode may be enabled and disabled in any desired manner, an illustrative technique being the setting and resetting of a user configuration bit.

With reference to FIG. 9, a page is loaded into the page buffer, either automatically at power-up (illustratively page 0 of the NAND memory array) or in response to a Page Data Read instruction, or in any other desired manner (block 510). The page is then replicated to the cache register (the page may be replicated in its entirety, or only the first part of the data register may be replicated to the first part of the cache register), and ECC processing is performed on the first part of the cache register.

With further reference to FIG. 9, the status of the BUSY bit ("BS") may be checked (block 520) by using a Read Status Register (0Fh/05h) instruction containing the address of the status register containing the BUSY bit. The status register bits are then shifted out on the DO pin at the falling edge of CLK. When the BUSY bit has been cleared (block 520—no) and a Read Data instruction received (block 522—yes), a continuous page read may now proceed by performing ECC processing of data and output of data from the two parts CR-0 and CR-1 of the cache register in alternation, further coordinated with replication of data from the data register to the cache register and the loading of subsequent pages from the NAND flash array into the data register. As indicated by blocks 530, 532 and 534, a read data proceeds with three different operations which occur with substantial overlap during the same period of time, namely outputting of the ECC status bits and then data onto the data bus from the first part CR-0 of the cache register (block 530), performing ECC on the second part CR-1 of the cache register and latching the results into the ECC status bits (block 532), and loading a successive page of the NAND flash array into the data register (block 534). The ECC status bits for the current partition and for the next partition may be pipelined generally in the manner shown in and described with reference to FIGS. 3-5, to ensure that the ECC status bits are synchronized with the outputted partition, and the ECC status may be reset after each latching. Next, as indicated by blocks 540 and 542, two different operations occur with substantial overlap during the same period of time, namely outputting onto the data bus of first the ECC status bits and then the data from the second part CR-1 of the cache register (block 540), and performing ECC on the first part CR-0 of the cache register and latching the results into the ECC status bits (block 542).

After the last page of the continuous page read operation and the ECC status bits for that page are read, the continuous page read with partition-by-partition ECC may be terminated in any desired manner, such as by taking CS\ high during page data outputting (not shown).

Figure 11:
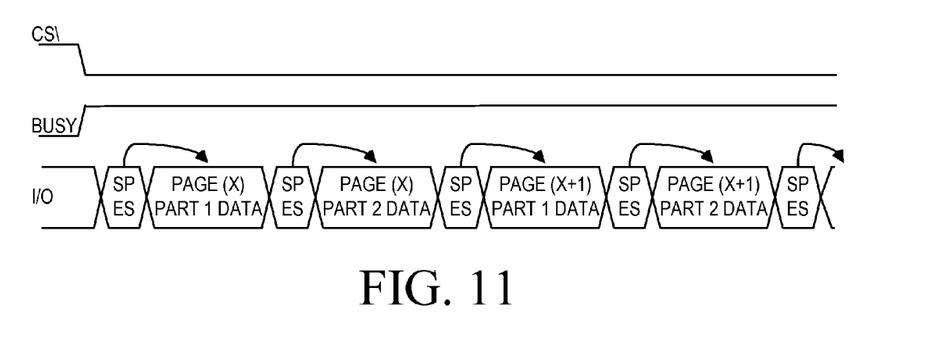
FIG. 11 is a signal diagram showing various signals involved in the functioning of a variation of the page buffer shown in FIG. 9.

In some instances, a user may wish to have access to the data in the spare area of each page. The method of FIG. 9 may be slightly modified to achieve this result by outputting part of the spare area along with the first part data from the cache register, and part of the spare area along with the second part data from the cache register. The corresponding signals are shown in FIG. 11, where "SP" indicates "spare area" and "ES" indicates ECC status bits. Alternatively, the entire spare area may be furnished as part of either the first part data or the second part data from the cache register.

Serial NAND Flash Memory Architecture

Figure 12:
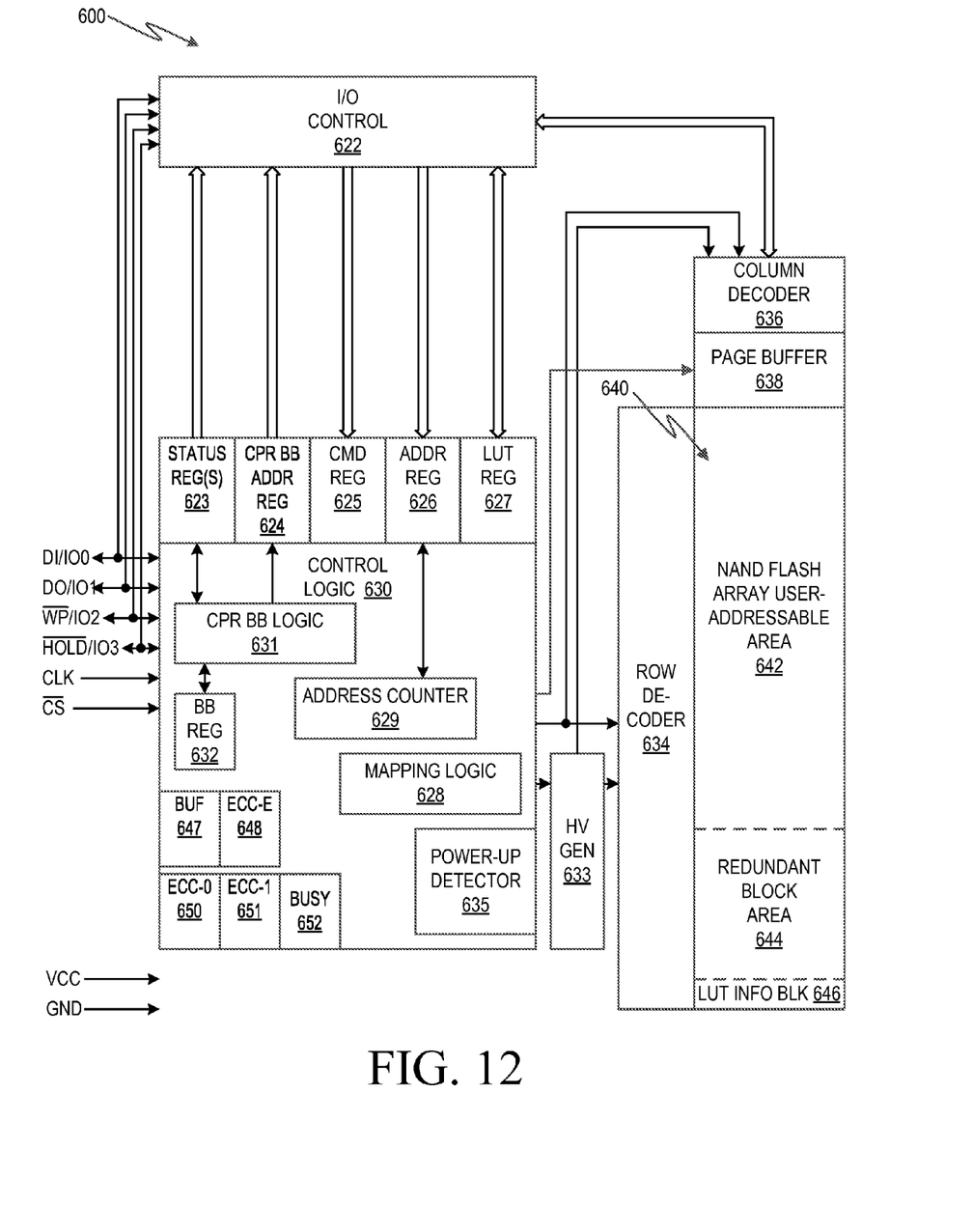
FIG. 12 is a schematic functional block diagram of a serial NAND flash memory device.

FIG. 12 is a schematic functional block diagram of an illustrative serial NAND flash memory 600 which is capable of providing a continuous read across page boundaries and from logically contiguous memory locations without wait intervals, and which is also capable of providing page-by-page ECC status information. The serial NAND flash memory 600 includes a NAND flash array 640 and associated page buffer 638. The NAND flash array 640 includes word (row) lines and bit (column) lines, and is organized into a user-addressable area 642, a redundant block area 644, and a LUT information block 646. Any desired flash memory cell technology may be used for the flash memory cells of the NAND flash array 640. The serial NAND flash memory 600 may include various other circuits to support memory programming, erase and read, such as row decoder 634, column decoder 636, I/O control 622, status register(s) 623, continuous page read ("CPR") address register(s) 624, command register 625, address register 626, a LUT register 627, control logic 630, CPR bad block logic 631, a CPR bad block register 632, and high voltage generators 633. The row decoder 634 selects rows of the user-addressable area 642 under user control as well as, in some implementations, under internal control; and selects rows of the redundant block area 644 and LUT information block 646 under internal control. Power is supplied (not shown) throughout the circuits of the serial NAND flash memory 600 by power lines VCC and GND. While the NAND flash memory 600 may be packaged in any desired manner and may have any type of interface, including ordinary NAND flash memory interfaces, the control logic 630 of FIG. 12 illustratively implements the SPI/QPI protocol, including the multi-IO SPI interface. Additional detail on the SPI/QPI interface and on the various circuits of the memory may be found in U.S. Pat. No. 7,558,900 issued Jul. 7, 2009 to Jigour et al. entitled "Serial Flash Semiconductor Memory," and in the aforementioned data sheet by Winbond Electronics Corporation, W25N01 GV SpiFlash 3V 1 G-Bit Serial SLC NAND Flash Memory with Dual/Quad SPI & Continuous Read, Preliminary Revision B, Nov. 26, 2013, which hereby are incorporated herein in their entirety by reference thereto.

If mode switching is desired, a buffer mode flag BUF 647 may be provided. The buffer mode flag 647 may be provided as a bit of the status register(s) 623 if desired. A power-up detector 635 is provided in the control logic 630 to initiate the setting of a particular mode and the loading of a default page upon power-up.

BUSY 652 is a read only bit in the status register that is set to a 1 state when the device is powering up or executing various instructions, including the Page Data Read instruction and the Continuous Read instruction.

The page buffer 638 illustratively includes a one-page data register (not shown), a one-page cache register (not shown), and one page of gates (not shown) for replicating data from the data register to the cache register. Any suitable latch or memory technology may be used for the data register and the cache register, and any suitable gating technology may be used for replicating data from the data register to the cache register. The data register and the cache register may be organized in any desired number of respective portions by, for example, the manner in which the transmission gates are wired and operated to control transmission of data. Illustratively, the data register and the cache register may be organized in two respective portions each, and operated in alternation by using respective groups of transmission gates controlled by respective control lines. The data register and the cache register of the page buffer 638 may be operated in a conventional manner by applying the same control signal to respective transmission gate control lines, or may be operated in alternation by applying suitable timed control signals to the transmission gate control lines. Illustratively in a two portion implementation in which a page is 2K Bytes, a half-page (1K) of transmission gates may be controlled by one control line and the other half-page (1K) of transmission gates may be controlled by another control line, thereby organizing the data register and the cache register in two half-page (1K) portions. Because of the operation of two portions in alternation, a two-portion implementation of the page buffer 638 may be referred to as a "ping pong" buffer. An ECC circuit (not show) may be provided to perform ECC computations on the contents of the cache register depending on the status of an ECC-E flag 648. ECC status bits ECC-0 650 and ECC-1 651 are provided to indicate the error condition of the data in the associated page, and may be checked after the completion of a Read operation to verify the data integrity. The ECC-E 648, ECC-0 650 and ECC-1 651 bits may be provided as part of the status register(s) 623 if desired.

A different size of page buffer may be used and/or a division of the page buffer into more than two portions or into unequal portions may be done if desired. Two sets of control signals may be needed for two portions of the page buffer, unlike one set of control signals needed for an undivided page buffer. Furthermore, differences between the logical and physical NAND flash array does not affect teachings herein. For example, the physical array may have two pages (even 2 KB page and odd 2 KB page) on one word line, so that a word line may be 4 KB of NAND bit cells. For clarity, the description and drawings herein are based upon the logical NAND flash array. The error correction circuit 220 logically may be thought of as having a section ECC-0 which provides error correction of the contents of the cache register portion CR-0, and a section ECC-1 which provides error correction of the contents of the cache register portion CR-1. Various ECC algorithms are suitable for use, including, for example, Hamming ECC algorithm, BCH ECC algorithm, Reed-Solomon ECC algorithm, and others. While two logical ECC sections ECC-0 and ECC-1 are shown as respectively interfacing with CR-0 and CR-1 for clarity of explanation, either two physical ECC blocks or a single physical ECC block may be used to interface with both CR-0 and CR-1. Additional detail on the page buffer 638, the ECC circuit, and their operations may be found in the aforementioned U.S. Pat. No. 8,667,368 Issued Mar. 4, 2014 to Gupta et al. and entitled "Method and Apparatus for Reading NAND Flash Memory," which hereby is incorporated herein in its entirety by reference thereto. Continuous page read as described herein is referred to as "modified continuous page read" in the aforementioned patent application. This manner of organizing the data register and cache register into portions and performing ECC on the portions is illustrative, and other techniques may be used if desired.

While the NAND flash memory 600 is organized and operated to perform a variety of read operations including continuous page read operations and on-chip ECC in a single-plane NAND Architecture, this architecture is illustrative and variations thereof are contemplated. It will be appreciated that the example of a 2 KB Page size and a specific block size are illustrative and may be different if desired. Moreover, the specific size reference is not to be taken literally, since the actual page size may vary depending on design factors; for example, the term may include a 2,048 Byte main area plus an additional 64 Byte spare area, where the spare area is used for storing ECC and other information such as meta data. In the same way, the term 1 KB may refer to a 1,024 Byte main area and a 32 Byte spare area. While the description herein is based upon a single-plane architecture for clarity, the teachings set forth herein are equally applicable to multi-plane architectures. When multiple physical planes are used, they may share one or more word-lines so that the memory system may service multiple I/O requests simultaneously. Each plane provides a page of data and includes a corresponding data register of one page size and a corresponding cache register of one page size. The techniques described herein may be applied to each plane separately such that each data register and cache register is organized in multiple portions, or may be applied to multiple planes such that each data register and cache register is itself one portion of a multiple page data register and cache register.

FIG. 12 also shows control signals /CS, CLK, DI, DO, /WP and /HOLD which are for the SPI interface. The standard SPI flash interface provides /CS (chip select-complement), CLK (clock), DI (serial data-in), and DO (serial data-out) signals, along with optional signals /WP (write protect—complement) and /HOLD (hold—complement). While the 1-bit serial data bus (data-in through DI and data-out through DO) in the standard SPI interface provides a simple interface and compatibility with many controllers which boot up in single SPI mode, it is limited in achieving higher read thru-put. A multi-bit SPI interface therefore evolved to additionally support dual (2-bit interface) and/or quad (4-bit interface) for increased read thru-put. FIG. 12 also shows additional data bus signals for Dual SPI and Quad SPI operation, i.e. I/O(0), I/O(1), I/O(2), and I/O(3), by selectively redefining the function of four pins. In one illustrative version of the Quad SPI read operation (other versions may be envisioned), the appropriate read instruction may be given with 1-bit standard SPI interface through I/O(0), but subsequent interface for address and data-out may be Quad based (i.e. 4-bit data bus). The Quad SPI read operation can output 4-bits of data in a clock cycle as compared to output 1-bit of data in standard SPI read operation, and therefore the Quad SPI read operation can provide four times higher read thru-put. While Quad SPI read operation is used herein for explanation, the teachings herein are equally applicable to the other modes of operation, including but not limited to single SPI, dual SPI, Quad Peripheral Interface ("QPI") and Double Transfer Rate ("DTR") read modes. In the QPI protocol, the complete interface (opcode, address, and data-out) is done on 4-bit basis. In the DTR protocol, the output data is provided on both low-going and high-going CLK edge, rather than providing output data only on low-going CLK edge as in Single Transfer Rate ("STR") read mode operation.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. For example, although many of the implementations described herein are for serial NAND memory, certain techniques described herein such as the power-up sequence, mode selection, and continuous data output across page boundaries and from logically contiguous memory locations without wait intervals, may be used for parallel NAND memory. Moreover, specific values given herein are illustrative and may be varied as desired, and terms such as "first" and "second" are distinguishing terms and are not to be construed to imply an order or a specific part of the whole. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A method of sequentially reading data from a digital memory device comprising a NAND memory array and a page buffer coupled thereto, the page buffer being partitioned into at least a first part and a second part, comprising:
   accessing a page of data from the NAND memory array;
   establishing first error correction code ("ECC") processed data in the first part of the page buffer from the page of data;
   determining a first ECC status for the first ECC processed data;
   outputting the first ECC processed data from the first part of the page buffer;
   establishing second ECC processed data in the second part of the page buffer from the page of data, in an overlapping time relationship with the first ECC processed data outputting step;
   determining, from the first ECC status for the first ECC processed data and during the second ECC processed data establishing step, a second ECC status for a page of data comprising the first ECC processed data and the second ECC processed data;
   storing the second ECC status in a status register;
   accessing a first sequential page of data from the NAND memory array, in an overlapping time relationship with the first ECC processed data outputting step;
   outputting the second ECC processed data from the second part of the page buffer;
   establishing third ECC processed data in the first part of the page buffer from the first sequential page of data, in an overlapping time relationship with the second ECC processed data outputting step;
   determining a third ECC status for the third ECC processed data;
   outputting the third ECC processed data from the first part of the page buffer;
   establishing fourth ECC processed data in the second part of the page buffer from the first sequential page of data, in an overlapping time relationship with the third ECC processed data outputting step;
   determining, from the third ECC status for the third ECC processed data and during the fourth ECC processed data establishing step, a fourth ECC status for a page of data comprising the third ECC processed data and the fourth ECC processed data;
   storing the fourth ECC status in the status register; and
   accessing a second sequential page of data from the NAND memory array, in an overlapping time relationship with the third ECC processed data outputting step.

2. The method of claim 1, wherein:
   the page buffer comprises a cache register partitioned into at least a first part and a second part, and a data register partitioned into at least a first part and a second part corresponding to the first and second parts of the cache register;
   the second ECC processed data establishing step comprises performing ECC processing of data in the second part of the cache register to establish the second ECC processed data therein;
   the step of accessing the first sequential page comprises loading the first sequential page into the data register;
   the second ECC processed data outputting step comprises outputting the second ECC processed data from the second part of the cache register;
   the third ECC processed data establishing step comprises performing ECC processing of data in the first part of the cache register to establish the third ECC processed data therein;
   the third ECC processed data outputting step comprises outputting the third ECC processed data from the first part of the cache register; and
   the step of accessing the second sequential page comprises loading the second sequential page into the data register.

3. The method of claim 1 wherein the digital memory device comprises an input for receiving a chip select signal, further comprising:
   after completion of the second ECC status storing step, the second ECC processed data outputting step, and the third ECC processed data establishing step, deferring the third ECC processed data outputting step in response to a transition in the chip select signal;
   receiving a Read Status Register instruction;
   outputting the status register in response to the Read Status Register receiving step;
   after completion of the status register outputting step, receiving a Buffer Read instruction; and
   proceeding with the third ECC processed data outputting step in response to the Buffer Read instruction receiving step.

4. A digital memory device comprising:
   a NAND flash memory array;
   a row decoder coupled to the NAND flash memory array;
   a data register coupled to the NAND flash memory array and comprising at least a first part and a second part;
   a cache register coupled to the data register and comprising at least a first part and a second part corresponding to the first and second parts of the data register;
   an error correction code ("ECC") circuit coupled to the cache register;
   a column decoder coupled to the cache register; and
   a control circuit coupled to the row decoder, the column decoder, the data register, the cache register, and the ECC circuit, wherein the control circuit comprises logic and register elements for executing the functions of:
      loading a page of data from the NAND memory array into the data register;
      replicating a first portion of the page of data from the first part of the data register to the first part of the cache register;
      establishing first ECC processed data in the first part of the cache register from the first portion of the page of data;
      determining a first ECC status for the first ECC processed data;
      outputting the first ECC processed data from the first part of the cache register;
      replicating a second portion of the page of data from the second part of the data register to the second part of the cache register;
      establishing second ECC processed data in the second part of the cache register from the second portion of the page of data, in an overlapping time relationship with the first ECC processed data outputting function;
      determining, from the first ECC status for the first ECC processed data and as part of the second ECC processed data establishing function, a second ECC status for a page of data comprising the first ECC processed data and the second ECC processed data;

storing the second ECC status in a status register;
loading a first sequential page of data from the NAND memory array into the data register, in an overlapping time relationship with the first ECC processed data outputting function;
outputting the second ECC processed data from the second part of the cache register;
replicating a first portion of the first sequential page of data from the first part of the data register to the first part of the cache register;
establishing third ECC processed data in the first part of the cache register from the first portion of the first sequential page of data, in an overlapping time relationship with the second ECC processed data outputting function;
determining a third ECC status for the third ECC processed data;
outputting the third ECC processed data from the first part of the cache register;
replicating a second portion of the first sequential page of data from the second part of the data register to the second part of the cache register;
establishing fourth ECC processed data in the second part of the cache register from the second portion of the first sequential page of data, in an overlapping time relationship with the third ECC processed data outputting function;
determining, from the third ECC status for the third ECC processed data and as part of the fourth ECC processed data establishing function, a fourth ECC status for a page of data comprising the third ECC processed data and the fourth ECC processed data;
storing the fourth ECC status in the status register; and
loading a second sequential page of data from the NAND memory array into the data register, in an overlapping time relationship with the third ECC processed data outputting function.

5. A method of sequentially reading data from a digital memory device comprising a NAND memory array and a page buffer coupled thereto, the page buffer being partitioned into at least a first part and a second part, comprising:
accessing a page of data from the NAND memory array;
establishing first error correction code ("ECC") processed data in the first part of the page buffer from the page of data;
determining a first ECC status for the first ECC processed data;
outputting the first ECC processed data from the first part of the page buffer;
establishing second ECC processed data in the second part of the page buffer from the page of data, in an overlapping time relationship with the first ECC processed data outputting step;
determining, from the first ECC status for the first ECC processed data and during the second ECC processed data establishing step, a second ECC status for a page of data comprising the first ECC processed data and the second ECC processed data;
storing the second ECC status;
accessing a first sequential page of data from the NAND memory array, in an overlapping time relationship with the first ECC processed data outputting step;
outputting the second ECC processed data from the second part of the page buffer, and the second ECC status from the second ECC status storing step;
establishing third ECC processed data in the first part of the page buffer from the first sequential page of data, in an overlapping time relationship with the second ECC processed data outputting step;
determining a third ECC status for the third ECC processed data;
outputting the third ECC processed data from the first part of the page buffer;
establishing fourth ECC processed data in the second part of the page buffer from the first sequential page of data, in an overlapping time relationship with the third ECC processed data outputting step;
determining, from the third ECC status for the third ECC processed data and during the fourth ECC processed data establishing step, a fourth ECC status for a page of data comprising the third ECC processed data and the fourth ECC processed data;
storing the fourth ECC status;
accessing a second sequential page of data from the NAND memory array, in an overlapping time relationship with the third ECC processed data outputting step; and
outputting the fourth ECC processed data from the second part of the page buffer, and the fourth ECC status from the fourth ECC status storing step.

6. A method of sequentially reading data from a digital memory device comprising a NAND memory array and a page buffer coupled thereto, the page buffer being partitioned into at least a first part and a second part, comprising:
accessing a page of data from the NAND memory array;
establishing first error correction code ("ECC") processed data in the first part of the page buffer from the page of data;
determining a first ECC status for the first ECC processed data;
outputting the first ECC status;
outputting the first ECC processed data from the first part of the page buffer, following the first ECC status outputting step;
accessing a first sequential page of data from the NAND memory array, in an overlapping time relationship with the first ECC processed data outputting step;
establishing second ECC processed data in the second part of the page buffer from the page of data, in an overlapping time relationship with the first ECC processed data outputting step;
determining a second ECC status for the second ECC processed data;
outputting the second ECC status;
outputting the second ECC processed data from the second part of the page buffer, following the second ECC status outputting step;
establishing third ECC processed data in the first part of the page buffer from the first sequential page of data, in an overlapping time relationship with the second ECC processed data outputting step;
determining a third ECC status for the third ECC processed data;
outputting the third ECC status;
outputting the third ECC processed data from the first part of the page buffer, following the third ECC status outputting step;
accessing a second sequential page of data from the NAND memory array, in an overlapping time relationship with the third ECC processed data outputting step; and
establishing fourth ECC processed data in the second part of the page buffer from the first sequential page of data, in an overlapping time relationship with the third ECC processed data outputting step.

7. The method of claim 6, further comprising:
in conjunction with the first ECC status outputting step, outputting a spare area corresponding to the first ECC processed data;
in conjunction with the second ECC status outputting step, outputting a spare area corresponding to the second ECC processed data; and
in conjunction with the third ECC status outputting step, outputting a spare area corresponding to the third ECC processed data.

* * * * *